(12) United States Patent
Johansson et al.

(10) Patent No.: US 8,446,307 B2
(45) Date of Patent: May 21, 2013

(54) COMPARATOR NOISE REDUCTION BY MEANS OF A PROGRAMMABLE BANDWIDTH

(75) Inventors: Robert Johansson, Oslo (NO); Steffen Skaug, Oslo (NO); Timothy Bales, Bershire (GB)

(73) Assignee: Aptina Imaging Corporation, George Town (KY)

( * ) Notice: Subject to any disclaimer, the term of this patent is extended or adjusted under 35 U.S.C. 154(b) by 54 days.

(21) Appl. No.: 13/249,824

(22) Filed: Sep. 30, 2011

(65) Prior Publication Data

US 2013/0057422 A1    Mar. 7, 2013

Related U.S. Application Data

(60) Provisional application No. 61/531,285, filed on Sep. 6, 2011.

(51) Int. Cl.
*H03M 1/12* (2006.01)

(52) U.S. Cl.
USPC ........................................... 341/155; 341/156

(58) Field of Classification Search
USPC ................ 341/155, 158, 120; 327/55, 63, 73, 327/80, 198, 307
See application file for complete search history.

(56) References Cited

U.S. PATENT DOCUMENTS 7,554,388 B2 *   6/2009   Kudo ............................ 327/553

* cited by examiner

*Primary Examiner* — Joseph Lauture

(57) ABSTRACT

A comparator including a preamplifier amplifying a first signal and a second signal to produce a first amplified signal on a first output terminal and a second amplified signal on a second output terminal. The comparator also includes a capacitor, a clamp and a latch coupled in parallel to the first output terminal and the second output terminal of the preamplifier. A control circuit is coupled to the variable capacitor and the clamp and is configured to close the clamp during a first time period to cause the first amplified signal and the second amplified signal to bypass the capacitor and the latch, and open the clamp during a second time period following the first time period to cause the first amplified signal and the second amplified signal to be coupled to the capacitor and the latch. The capacitor filters the amplified signals, and the latch produces a digital output signal of the comparator based on the filtered signals.

20 Claims, 6 Drawing Sheets

| d1 | d0 | cl_in<2> | cl_in<1> | cl_in<0> |
|----|----|----------|----------|----------|
| 0  | 0  | 0        | 0        | 0        |
| 0  | 1  | 0        | 0        | 1        |
| 1  | 0  | 0        | 1        | 1        |
| 1  | 1  | 1        | 1        | 1        |

US 8,446,307 B2

COMPARATOR NOISE REDUCTION BY MEANS OF A PROGRAMMABLE BANDWIDTH

CROSS REFERENCE TO RELATED APPLICATIONS

This application claims priority of U.S. Provisional Patent Application Ser. No. 61/531,285 filed on Sep. 6, 2011, which is incorporated herein by reference.

FIELD OF THE INVENTION

The present invention relates, in general, to a comparator that includes circuitry for controlling a bandwidth of an amplifier within the comparator.

BACKGROUND OF THE INVENTION

Conventional comparators include a preamplifier and a latch. The preamplifier amplifies two input signals and then inputs the two amplified signals to the latch. The latch determines a digital output value based on the two amplified signals (i.e. a logic 0 or logic 1 is generated by the latch based on a comparisons between the two amplified signals).

These conventional comparators, however, suffer from noise in the amplifier and uncertainty in the latch decision. Due to the noise, conventional comparators may produce incorrect digital values based on the two input signals.

DETAILED DESCRIPTION

As described below, the present invention provides a comparator with a programmable bandwidth. Specifically, the comparator includes a capacitor (e.g., a variable or fixed capacitor) and a clamp (e.g., a switch) that are electrically coupled in parallel to the output terminals of a preamplifier and a regenerative latch included in the comparator.

In one example, the clamp is closed thereby shorting the output terminals of the preamplifier. This effectively bypasses the capacitor and the regenerative latch during the initial settling of the preamplifier. Once the preamplifier has settled sufficiently, the clamp is opened therefore electrically coupling the capacitor across the output terminals of the preamplifier which filters the amplified signals input to the regenerative latch. The regenerative latch then produces a digital output value based on the filtered input signals and a corresponding latch clock.

Figure 1A:
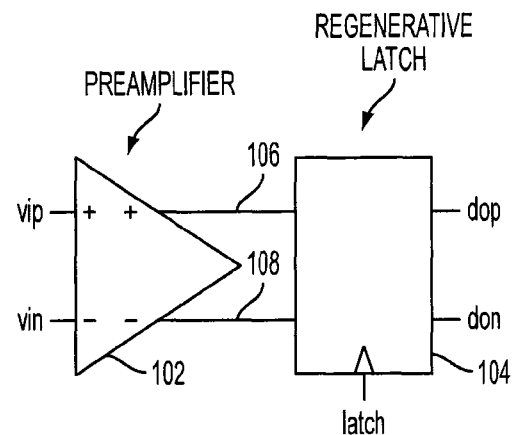
FIG. 1A is a circuit diagram of a comparator, according to an embodiment of the present invention.

Shown in FIG. 1A is a comparator that includes a preamplifier 102 and a regenerative latch 104. In general, two input signals (vip and vin) are input to the preamplifier and then output as amplified signals on output terminals 106 and 108. The amplified signals are then input to the regenerative latch where they are compared to each other to produce digital values on output terminals dop and don at the positive edge of the latch (i.e., the clock) signal.

Figure 1B:
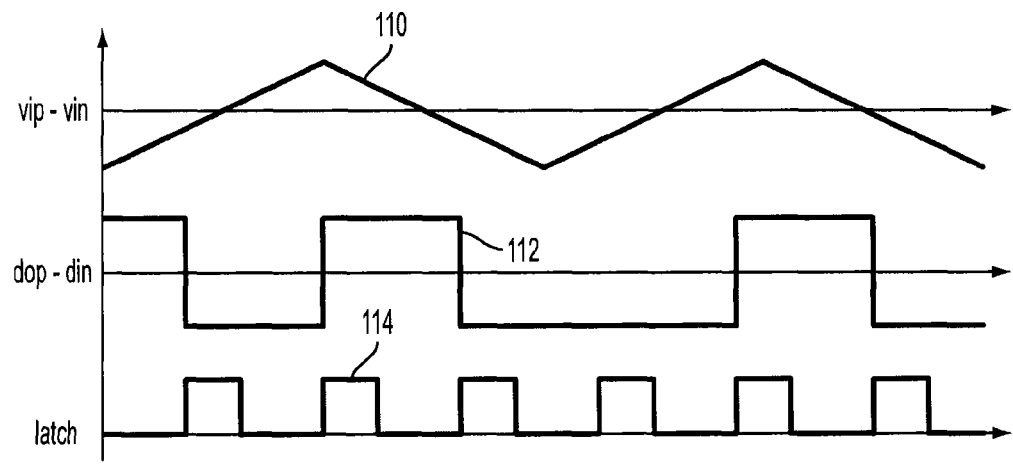
FIG. 1B is a timing diagram of the operation of the comparator in FIG. 1A, according to an embodiment of the present invention.

Shown in FIG. 1B is a timing diagram of the operation of the comparator shown in FIG. 1A. It is shown that when vip−vin (110) is negative, then a logic zero is produced by dop−din (112) on the positive edge of latch signal 114. In contrast, when 110 is positive, then a logic one is produced by 112 at the positive edge of latch signal 114. Thus, depending on whether vip is greater than vin, or vin is greater than vip, a logic one or a logic zero is respectively produced at 112. In general, dop and don are complementary outputs of regenerative latch 104.

Figure 2A:
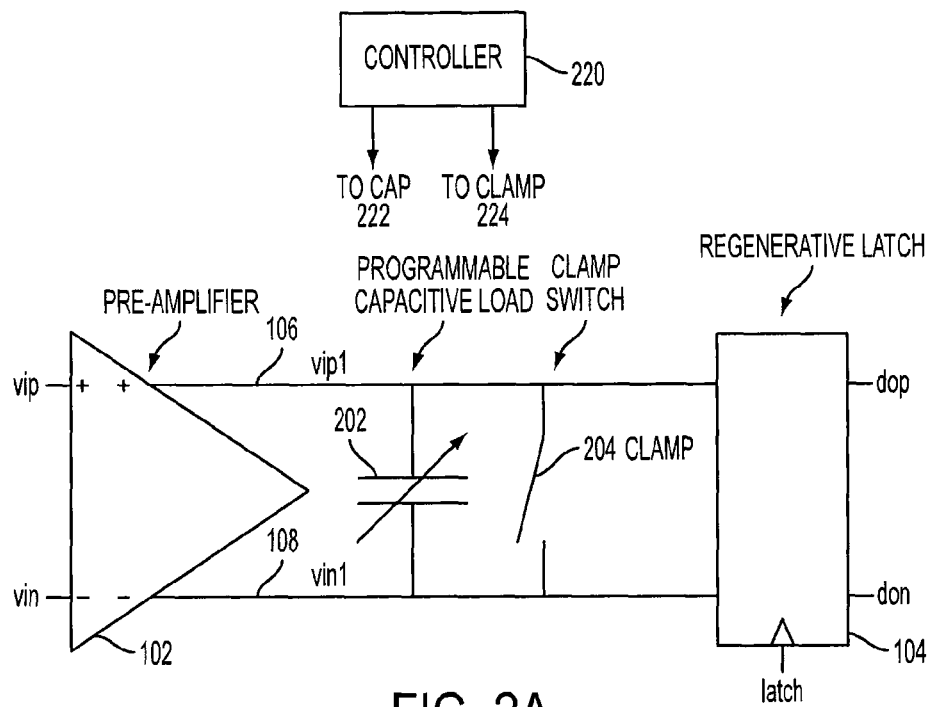
FIG. 2A is a circuit diagram of a comparator including a capacitor and a clamp, according to an embodiment of the present invention.

As shown in FIG. 2A, a variable capacitor 202 and a clamp 204 are electrically coupled in parallel between the output terminals 106 and 108 of the preamplifier and the input terminals of the regenerative latch. Although capacitor 202 is shown as being variable, it is also noted that capacitor 202 may be fixed value.

FIG. 2A also shows a comparator controller 220 that includes a control line 222 that adjusts the capacitance of capacitor 202 and a control line 224 which controls the opening and closing of clamp 204.

In general, capacitor 202 filters the output signals of the preamplifier in order to limit the bandwidth and reduce noise (i.e. produce a digital value from the latch within a predetermined amount of accuracy). Clamp 204 is utilized to shunt the capacitor so that the response time of the comparator is increased. In one example, during initial settling of the preamplifier output, clamp 204 is closed in order to short out terminals 106 and 108 and therefore bypass (i.e. shunt) capacitor 202. Once the preamplifier has settled sufficiently, the clamp is opened such that capacitor 202 filters the preamplifier output signals and reduces noise before the amplified signals are input through regenerative latch 104.

Figure 2B:
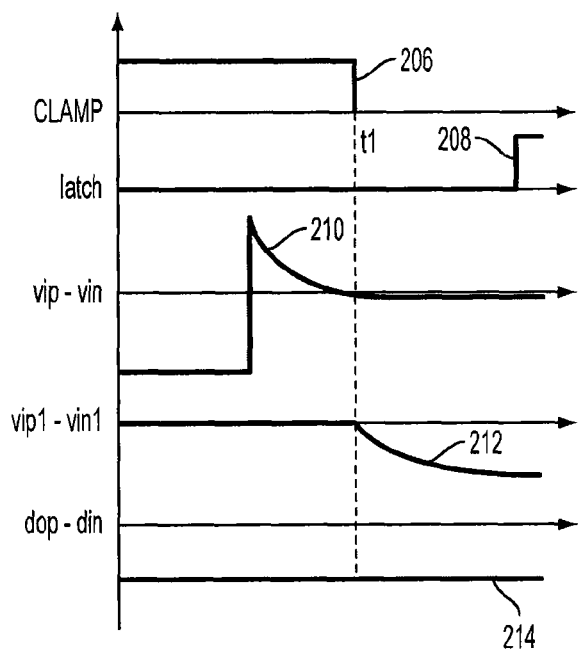
FIG. 2B is a timing diagram of the operation of the comparator in FIG. 2A, according to an embodiment of the present invention.

Shown in FIG. 2B is a timing diagram of the operation of the comparator in FIG. 2A. In a first time period (less than time t1), the clamp signal 206 is high therefore closing clamp switch 204. In general, as the amplifier is trying to settle due to the input signals vip and vin (i.e. prior to time t1), output signal 210 will be inaccurate. Specifically, 210 has large voltage swings in negative and positive direction before time t1 (i.e., during amplifier settling). Eventually, 210 settles to a sufficient voltage where clamp 206 may be released (i.e., the clamp is open at time t1 because vip−vin has settled).

At time t1, clamp 204 is opened (i.e. clamp signal 206 goes low) which allows terminals 106 and 108 to be electrically coupled to capacitor 202 and regenerative latch 104. Thus, output signals vip1 and vin1 of the preamplifier begin to reach a voltage value based on the input signals. This is shown in 212 where vip–vin1 is zero before time t1 and then begins to obtain a different value after time t1. Output of degenerative latch dop–din 214 eventually reaches its logic value when the latch clock signal 208 goes high.

Thus, overall settling time is improved by keeping the preamplifier output close to zero voltage until the comparator input has come close enough to the final voltage (i.e., the clamp is closed thereby shunting the capacitor until the preamplifier settles). Once the preamplifier settles, the capacitor performs filtering in order to reduce the noise of the preamplifier. It should be noted that preamplifier 102 as shown in FIGS. 1A and 2A may include plurality of preamplifier gain stages.

Figure 3A:
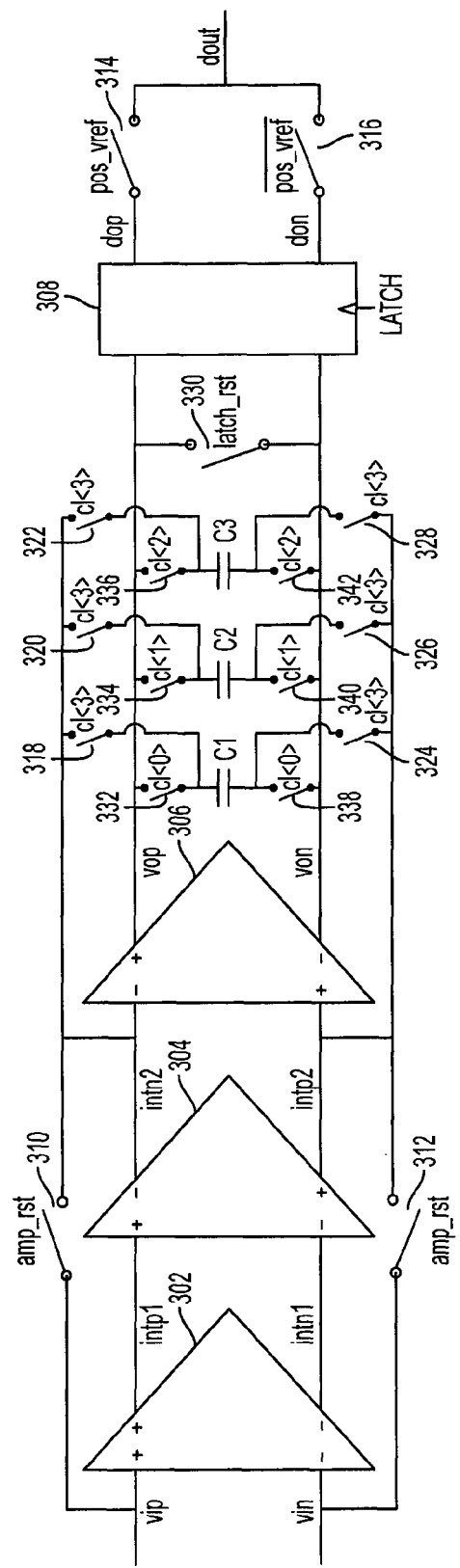
FIG. 3A is a circuit diagram of a comparator including a plurality of preamplifiers, a capacitor and a clamp, according to an embodiment of the present invention.

An example of the comparator having multiple gain stages is shown in FIG. 3A. Specifically, the comparator includes preamplifiers 302, 304 and 306 connected in cascade with each other. In general, these amplifiers successively amplify the input signals vip and vin with each stage. In one example, the amplification may be highest at the first stage and lowest at the last stage (i.e. the gain may be decreasing with each stage). The comparator may also include capacitors C1, C2 and C3 which may be polysilicon or metal capacitors. Capacitors C1, C2 and C3 may also be diode capacitors. The variable capacitor connected to the output of the preamplifiers may be selected by opening and closing switches 332, 334, 336, 338, 340 and 342. The capacitors may also be connected to the input stages of the cascaded preamplifiers based on switches 310, 312, 318, 320, 322, 324, 326 and 328. The comparator also includes clamp 330, regenerative latch 308 and output latch switches 314 and 316.

In general, during operation when the first two stages of 302 and 304 of the comparator are offset compensated (i.e., when switches 310 and 312 are closed), the programmable capacitive load may be connected across the input of the first stage 302, and the output of the second stage 304. This operation may be performed in order to ensure stability of the feedback loop of the cascaded preamplifiers. Switches 310, 312, 318, 320, 322, 324, 326 and 328 may then be opened, and the capacitors may be connected to the output of the third stage 306.

In general, switches 332, 334, 336, 338, 340 and 342 are selected by the controller (not shown) in order to provide a specific capacitance on the output terminals of last preamplifier 306 (i.e., the variable capacitance is set based on the six switches). In general, selecting the capacitance may be performed prior to or during the comparison process.

As described before with respect to FIG. 2A, clamp 330 may initially be closed to bypass capacitors C1, C2 and C3 as the preamplifiers are settling. Once the preamplifiers have settled, as clamp 330 opens thereby connecting all, or a subset of capacitors C1, C2 and C3 to the output terminals of last preamplifier 306 such that the amplified signals may be filtered before entering regenerative latch 308. Complementary outputs dop and don of latch 308 may be output onto terminal dout via switches 314 and 316.

Figures 3B, 3C:
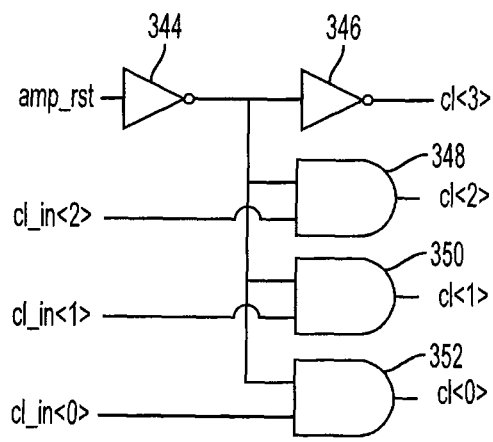
FIG. 3B is a logic circuit for controlling the comparator in FIG. 3A, according to an embodiment of the present invention.
FIG. 3C is a logic table corresponding to the operation of the logic circuit in FIG. 3B, according to an embodiment of the present invention.

An example of the logic for controlling the various switches in FIG. 3A is shown in FIG. 3B and FIG. 3C where a logic circuit and a corresponding logic table are respectively shown. Specifically, the logic circuit may include logic inverters 344 and 346 and also include AND gates 348, 350 and 352. Although FIG. 3B shows a logic circuit, it is contemplated that control of the preamplifier, the latch and the various switches within the comparator shown in FIGS. 1A, 2A and 3A may be performed by controller 220. Specifically, it is noted that controller 220 may include specific analog and digital circuits, a processor, or a field programmable gate array (FPGA) to perform control of the various components in the comparator.

Figure 4:
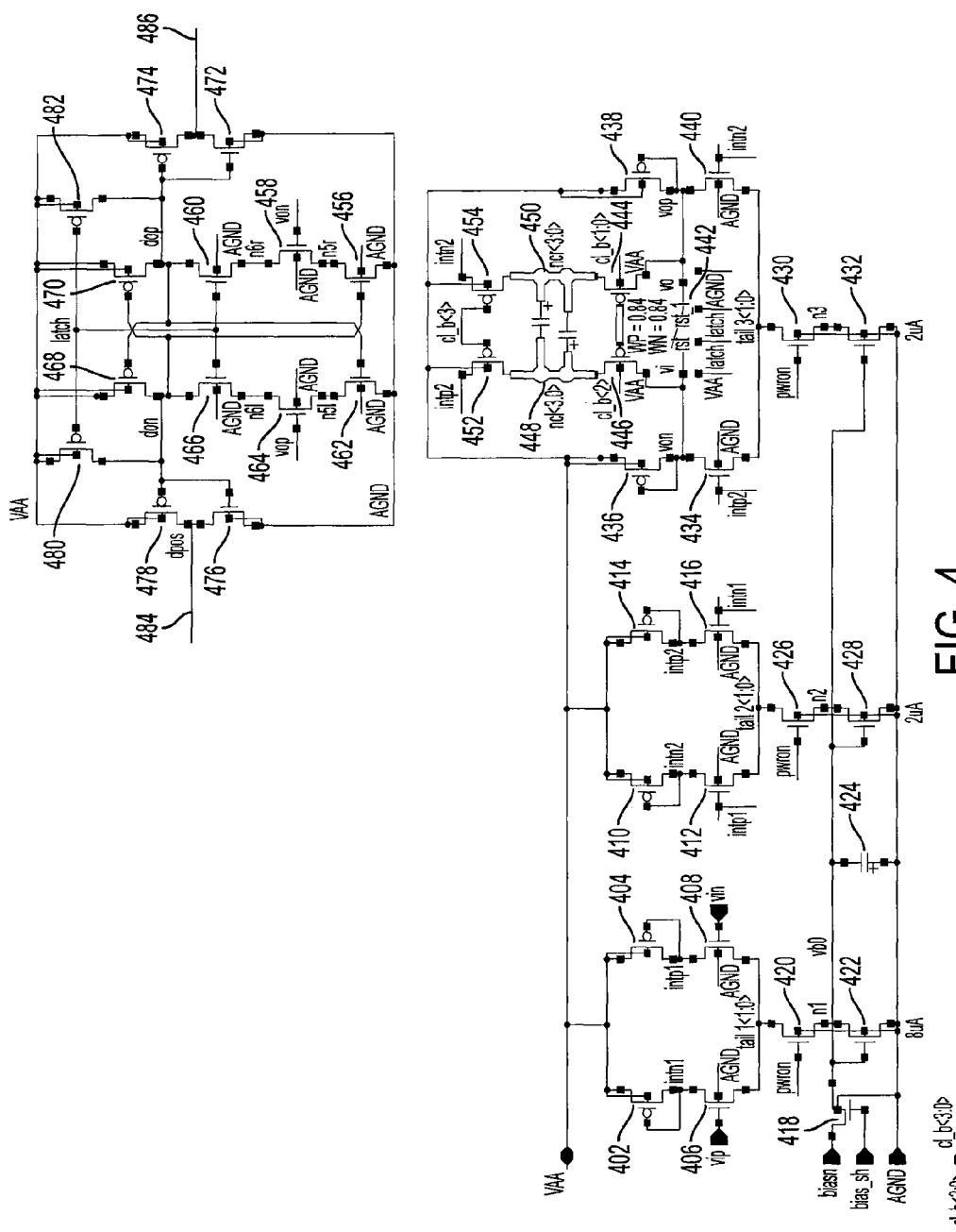
FIG. 4 is a detailed circuit diagram of the comparator in FIG. 3A, according to an embodiment of the present invention.

FIG. 4 shows a more detailed circuit diagram of the comparator shown in FIG. 3A having the three gain stages. Specifically, the first gain stage is shown as transistors 402, 404, 406 and 408. The second gain stage is shown as transistors 410, 412, 414 and 416, and the third gain stage is shown as transistors 434, 436, 438 and 440. Each of the three gain stages may include various transistors for providing power and/or bias current to the three gain stages (i.e., transistors 418, 420, 422, 426, 428, 430 and 432 and capacitor 424). The third gain stage may also include transistors 452, 454, 446 and 444. The clamp switch of the comparator is shown as element 442, and the capacitor of the comparator is shown as elements 448 and 450. Furthermore, the regenerative latch of the comparator is shown as including transistors 456, 458, 460, 462, 464, 466, 468, 470, 472, 474, 476, 478, 480 and 482.

In general, the circuit shown in FIG. 4 operates similarly to the circuit in FIG. 3A. Specifically, the input signals are input through transistors 406 and 408. The first amplified signals are input through transistors 412 and 416 in the second stage. The second amplified signals are input through transistors 434 and 440 in the third stage. The amplified signals from the third stage vop and von are shorted together by clamp 442 when it is closed during the initial settling of the preamplifiers. Once the preamplifiers are settled, switch 442 is opened allowing variable capacitor 448 and 450 to filter vop and von which are then input to regenerative latch through transistors 464 and 458. The regenerative latch then produces outputs don and dop on output lines 484 and 486 respectively.

It is noted that although FIG. 4 shows a specific implementation of the comparator in FIG. 3A, that other implementations are possible. Other equivalent implementations utilizing different transistors and/or configurations of transistors may be utilized.

Figure 5A:
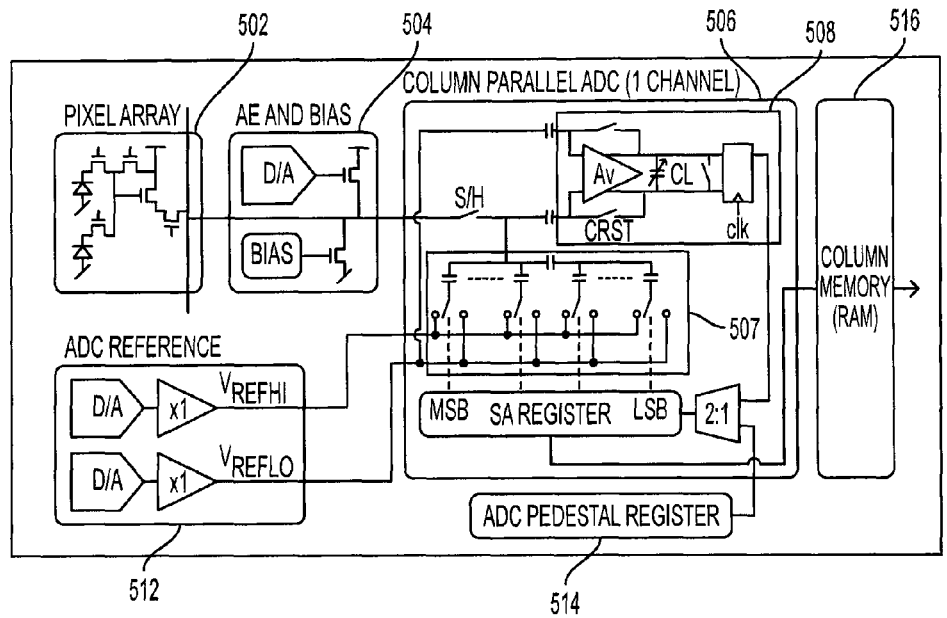
FIG. 5A is a circuit diagram of a complementary metal oxide semiconductor (CMOS) imager including the comparator in FIG. 2A, according to an embodiment of the present invention.
Figure 5B:
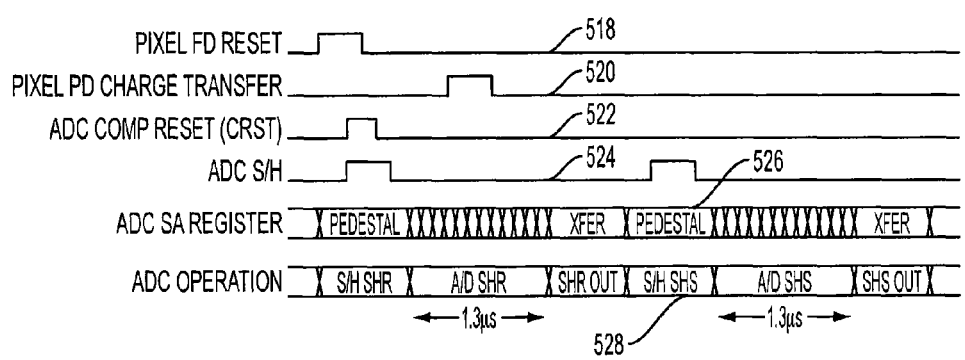
FIG. 5B is a timing diagram of the operation of the CMOS imager in FIG. 5A, according to an embodiment of the present invention.

One possible implementation of the comparator shown in FIG. 2A may be in an successive approximation analog digital converter (see SAADC). Furthermore, the SAADC may be included in a complementary metal oxide semi-conductor (CMOS) imager. An example of the comparator implemented in a CMOS imager is shown in FIG. 5A along with the corresponding timing diagram in FIG. 5B.

In general, the imager may include a pixel array 502, bias circuitry 504, a column ADC 506 which includes comparator 508, a column memory 510, an ADC register 514, capacitors 507 and an ADC reference 512. It is noted that other components (not shown) may also be included in the CMOS imager.

In general, the column ADC 506 may be utilized to convert the analog pixel voltage from the column line to a digital pixel value that is stored in column memory 510. In order to digitize the analog voltage from the pixel array, the value of the analog pixel voltage on the column line may be input to one terminal of the preamplifier in comparator 508. The other input terminal of the preamplifier of comparator 508 may be connected to a reference voltage (i.e. e.g., VREFLO). During operation, the regenerative latch output of comparator 508 may be input to the multiplexer that controls the register of capacitors 507. The register of capacitors may couple a reference voltage to the input terminal of the preamplifier. This effectively adjusts the analog pixel voltage applied to the input of the preamplifier such that successive additions of capacitors 507 may eventually produce a voltage value that exceeds the reference voltage applied to the other terminal of the preamplifier.

The overall operation of the components is shown in timing diagram 5B where the pixel reset signal 518, pixel charge transfer signal 520, and ADC comp reset 522, analog digital sample hold 524, ADC register 526 and ADC operation 528 are shown. It is noted that during the operation for converting the pixel value from the analog domain to the digital domain, the variable capacitor and the clamp switch within comparator 508 operate similarly to the variable capacitor and clamp shown in FIG. 2A (i.e., the clamp is initially closed to allow the preamplifier to settle and then opened to filter the preamplifier output signals before they are input to the regenerative latch).

It is noted that the various switches (i.e., the clamps which are shown in FIG. 2A and the switches shown in FIG. 3A) may be implemented by a transmission gate or a single transistor. It is also noted that the comparator may include N preamplifier stages and M polysilicon or metal capacitors that are selectively coupled to each other (where N and M are energy values). It is also noted that the gain of the various preamplifier stages may be adjusted accordingly.

In one example, when the comparator 508 is included in the CMOS imager, the variable capacitance may be updated once per frame to account for varying image brightness. The value of the variable capacitance may also be set based on the estimated or measured analog pixel voltage on the column line (i.e., the variable capacitance as well as the clamp timing may be controlled based on the image captured by the pixel array).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A comparator, including:
   a preamplifier amplifying a first signal and a second signal to produce a first amplified signal on a first output terminal and a second amplified signal on a second output terminal;
   a variable capacitor, a clamp and a latch coupled in parallel to the first output terminal and the second output terminal of the preamplifier; and
   a control circuit coupled to the variable capacitor and the clamp, the control circuit configured to:
   close the clamp during a first time period to cause the first amplified signal and the second amplified signal to bypass the capacitor and the latch, and
   open the clamp during a second time period following the first time period to cause the first amplified signal and the second amplified signal to be coupled to the capacitor and the latch, the capacitor filtering the amplified signals, and the latch producing a digital output signal of the comparator based on the filtered signals.

2. The comparator of claim 1,
   wherein the capacitor is a variable capacitor comprising a plurality of capacitors selectively coupled in parallel to the first output terminal and the second output terminal of the preamplifier.

3. The comparator of claim 1,
   wherein the clamp is a transmission gate or a single transistor for electrically coupling the first output terminal to the second output terminal.

4. The comparator of claim 1,
   wherein the preamplifier includes a plurality preamplifiers coupled in cascade to amplify the first signal and the second signal in a plurality of successive stages.

5. The comparator of claim 1,
   wherein the capacitor is a variable capacitor that has a capacitance set by the control circuit based on noise of signals applied to the comparator prior to the second time period.

6. The comparator of claim 1,
   wherein a length of the first time period and a length of the second time period are set based on a settling time of the preamplifier.

7. The comparator of claim 1,
   wherein the comparator is included in an imager device as part of a successive approximation analog to digital converter (SA ADC), the comparator comparing an analog pixel voltage as the first signal to an analog reference voltage as the second signal, the digital output signal controlling a plurality of capacitors to adjust the first signal during the comparison.

8. A comparator, including:
   a plurality of preamplifiers coupled in cascade amplifying a first signal and a second signal to produce a first amplified signal on a first output terminal of a last preamplifier in the cascade and a second amplified signal on a second output terminal of the last preamplifier in the cascade;
   a capacitor, a clamp and a latch coupled in parallel to the first output terminal and the second output terminal;
   a reset switch coupled to the capacitor and the other amplifiers in the cascade; and
   a control circuit coupled to the capacitor, the clamp and the reset switch, the control circuit configured to:
   close the reset switch during a reset time period to couple the capacitor to the other amplifiers in the cascade,
   close the clamp during a first time period to cause the first amplified signal and the second amplified signal to bypass the capacitor and the latch, and
   open the clamp during a second time period following the first time period to cause the first amplified signal and the second amplified signal to be coupled to the capacitor and the latch, the capacitor filtering the amplified signals, and the latch producing a digital output signal of the comparator based on the filtered signals.

9. The comparator of claim 8,
   wherein the capacitor is a variable capacitor comprising a plurality of capacitors selectively coupled in parallel to the first output terminal and the second output terminal of the last preamplifier.

10. The comparator of claim 8, including
    a first switch coupling the capacitor to the first output terminal and second output terminal of the last preamplifier; and
    a second switch coupling the capacitor to the reset switch,
    wherein the first switch and second switch are complementarily controlled with respect to each other.

11. The comparator of claim 10,
    wherein the control circuit closes the reset switch and the second switch to stabilize a feedback loop connecting output terminals and input terminals of the preamplifiers in the cascade.

12. The comparator of claim 10,
    wherein during the second time period, the control circuit opens the reset switch and the second switch, and closes the first switch to couple the capacitor to the output terminals of the last preamplifier.

13. The comparator of claim 8,
wherein the control circuit sets a length of the first time period to ensure proper settling of the first amplified signal and the second amplified signal before they are input to the latch.

14. The comparator of claim 8,
wherein the control circuit sets a capacitance of the capacitor based on noise levels of signals applied to the comparator, and sets a length of the first time period and a length of the second time period based on timing requirements of the comparator.

15. A method for controlling a comparator, the comparator including a preamplifier, a variable capacitor and a clamp, the method including:
amplifying, by the preamplifier, a first signal and a second signal to produce a first amplified signal and a second amplified signal;
closing, by a control circuit, the clamp during a first time period to cause the first amplified signal and the second amplified signal to bypass the capacitor and the latch, and
opening, by the control circuit, the clamp during a second time period following the first time period to cause the first amplified signal and the second amplified signal to be filtered by the capacitor, and then converted by the latch to a digital output signal of the comparator.

16. The method of claim 15, including:
setting, by the control circuit, a capacitance of the capacitor based on a bandwidth requirement of the preamplifier to produce the digital output signal within a predetermined amount of accuracy.

17. The method of claim 15, including:
setting, by the control circuit, a length of the first time period based on a timing requirement of the comparator to produce the digital output signal within a predetermined time window.

18. The method of claim 15, including:
setting, by the control circuit, a capacitance of the capacitor prior to the second time period.

19. The method of claim 15, wherein the comparator is included in a successive approximation analog to digital converter (SA ADC), the method including:
comparing, by the comparator, an analog input voltage as the first signal to an analog reference voltage as the second signal, the digital output signal controlling a plurality of capacitors to adjust the analog input voltage during the comparison.

20. The method of claim 15, wherein the comparator is included in a successive approximation analog to digital converter (SA ADC) that is included in a complementary metal oxide semiconductor (CMOS) imager, the method including:
comparing, by the comparator, an analog pixel voltage as the first signal to an analog reference voltage as the second signal, the analog pixel voltage being read during column readout of a pixel array in the CMOS imager; and
controlling, by the comparator, using the digital output signal of the latch, a plurality of register capacitors to adjust the analog pixel voltage, the comparison producing a digital pixel value based on the analog pixel voltage.

* * * * *